(12) United States Patent
Subramanian et al.

(10) Patent No.: US 6,465,889 B1
(45) Date of Patent: Oct. 15, 2002

(54) SILICON CARBIDE BARC IN DUAL DAMASCENE PROCESSING

(75) Inventors: Ramkumar Subramanian; Fei Wang, both of San Jose; Lynne A. Okada, Sunnyvale; Calvin T. Gabriel, Cupertino; Darrell M. Erb, Los Altos, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/778,109

(22) Filed: Feb. 7, 2001

(51) Int. Cl.[7] ..................... H01L 23/48; H01L 21/4763
(52) U.S. Cl. .................. 257/760; 257/762; 438/624; 438/636
(58) Field of Search ................. 438/622, 624, 438/636; 257/758, 759, 760, 762

(56) References Cited

U.S. PATENT DOCUMENTS

| | | | | |
|---|---|---|---|---|
| 5,872,385 A | * | 2/1999 | Taft et al. ................... | 257/437 |
| 6,184,128 B1 | * | 2/2001 | Wang et al. ................. | 438/637 |
| 6,218,292 B1 | * | 4/2001 | Foote ........................... | 438/636 |
| 6,297,521 B1 | * | 10/2001 | Forbes et al. ................. | 257/76 |
| 6,309,955 B1 | * | 10/2001 | Subramanian et al. ...... | 438/618 |
| 6,326,692 B1 | * | 12/2001 | Pangrle et al. .............. | 257/758 |
| 2001/0045655 A1 | * | 11/2001 | Matsubara ................... | 257/758 |

* cited by examiner

Primary Examiner—T. N. Quach

(57) ABSTRACT

The dimensional accuracy of trenches and, hence, the width of metal lines, in damascene interconnection structures is improved by employing silicon carbide as a capping layer/BARC on an underlying metal feature, e.g., Cu. Embodiments include via first-trench last dual damascene techniques employing a silicon carbide capping layer/BARC having an extinction coefficient (k) of about −0.2 to about −0.5, without the need for a middle etch stop layer, thereby improving efficiency by reducing the number of processing steps.

20 Claims, 8 Drawing Sheets

SILICON CARBIDE BARC IN DUAL DAMASCENE PROCESSING

TECHNICAL FIELD

The present invention relates to semiconductor devices having accurately dimensioned interconnection patterns. The present invention is particularly applicable to ultra large-scale integrated (ULSI) circuit devices having features in the deep sub-micron regime.

BACKGROUND ART

As integrated circuit geometries continue to plunge into the deep sub-micron regime, the requirements for dimensional accuracy becomes increasingly difficult to satisfy. Integration technology is considered one of the most demanding aspects of fabricating ULSI devices. Demands for ULSI semiconductor wiring require increasingly denser arrays with minimal spacings between narrower conductive lines. Implementation becomes problematic in manufacturing semiconductor devices having a design rule of about 0.12 micron and under.

Conventional semiconductor devices comprise a semiconductor substrate, typically doped monocrystalline silicon, and a plurality of sequentially formed interlayer dielectrics and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different levels, i.e., upper and lower levels, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as feature sizes shrink into the deep sub-micron regime.

It A conductive plug filling a via hole is typically formed by depositing an interlayer dielectric (ILD) on a conductive layer comprising at least one conductive feature, forming an opening through the ILD by conventional photolithographic and etching techniques, and filling the opening with a conductive material. Excess conductive material or the overburden on the surface of the ILD is typically removed by chemical-mechanical polishing (CMP). One such method is known as damascene and basically involves forming an opening in the ILD and filling the opening with a metal. Dual damascene techniques involve forming an opening comprising a lower contact hole or via hole section in communication with an upper trench section, which opening is filled with a conductive material, typically a metal, to simultaneously form a conductive plug in electrical contact with a conductive line.

Copper (Cu) and Cu alloys have received considerable attention as alternative metallurgy to aluminum (Al) in interconnect metallizations. Cu is relatively inexpensive, easy to process, and has a lower resistively than Al. In addition, Cu has improved electrical properties vis-à-vis tungsten (W), making Cu a desirable metal for use as a conductive plug as well as conductive wiring. However, due to Cu diffusion through dielectric materials, such as silicon dioxide, Cu interconnect structures must be encapsulated by a diffusion barrier layer. Typical diffusion barrier materials include tantalum (Ta), tantalum nitride (TaN), titanium (Ti), titanium nitride (TiN), titanium-tungsten (TiW), Tungsten (W), tungsten nitride (WN), Ti-TiN, titanium silicon nitride (TiSiN), tungsten silicon nitride (WSiN), tantalum silicon nitride (TaSiN) and silicon nitride for encapsulating Cu. The use of such barrier materials to encapsulate Cu is not limited to the interface between Cu and the ILD, but includes interfaces with other metals as well.

Cu interconnect technology, by and large, has been implemented employing damascene techniques, wherein a first dielectric layer, such as a silicon oxide layer, e.g., derived from tetraethyl orthosilicate (TEOS) or silane, or a low dielectric constant material, i.e., a material having a dielectric constant of no greater than about 3.9 (with a dielectric constant of 1 representing a vacuum), is formed lover an underlying metal level having a capping layer thereon, e.g., a Cu or Cu alloy features with a silicon nitride capping layer. A barrier layer and optional seedlayer are then deposited, followed by Cu deposition, as by electrodeposition or electroless deposition.

In implementing dual damascene techniques, particularly via first-trench last dual damascene processing, on a silicon nitride capped lower Cu or Cu alloy feature, it was found difficult to form the overlying trench with a high degree of dimensional accuracy. It was also found that such dual damascene processing required a large number of manipulative steps, thereby reducing efficiency and increasing manufacturing costs.

In implementing conventional damascene techniques, for example as schematically illustrated in FIGS. 1 through 3, an underlying metal feature 16, e.g., a Cu or Cu alloy line, is formed in an underlying dielectric layer 10 with a silicon nitride capping layer 11 formed thereon. Silicon nitride capping layer 11 does not exhibit favorable anti-reflective properties to enable subsequent photolithographic processing with high dimensional accuracy, particularly as dimensions plunge into the deep sub-micron regime. Silicon oxynitride is not a viable candidate for capping layer 11, since silicon oxynitride would not effectively prevent Cu diffusion.

As further illustrated in FIG. 1, a first dielectric layer 12 is formed over underlying dielectric layer 10 on capping layer 11, a middle etch stop layer 13, such as silicon oxynitride, is formed on dielectric layer 12, and a second dielectric layer 14 is formed on middle etch stop layer 13. A photoresist mask (not shown) is then formed on second dielectric layer 14 and anisotropic etching is conducted to form via hole 15 extending through second dielectric layer 14, middle etch stop layer 13 and first dielectric layer 12. A thin organic bottom anti-reflective coating (BARC) 17 is then optionally formed at the bottom of via hole 15.

A second photoresist mask 18 is then formed over second dielectric layer 14. Second photoresist mask 18 typically has a thickness "T" of about 4,000 Å to about 6,000 Å and contains an opening "W" substantially corresponding to the width of the trench to be formed in second dielectric layer 14.

Adverting to FIG. 3, anisotropic etching is then conducted to form a trench 20 in second dielectric layer 14 stopping on middle etch stop layer 13 which is selected for its high etch selectivity with respect to second dielectric layer 14. Optional organic BARC 17 is removed during or subsequent to trench formation. In implementing Cu or Cu alloy metallization, a barrier layer 30, such as Ta or TaN, is deposited to line the dual damascene opening comprising upper trench 20 communicating with lower via hole 12, and a seedlayer 31 deposited thereon. A Cu or Cu alloy is then deposited by electrodeposition or electroless deposition to fill the dual damascene opening. The over-burden is then removed by chemical-mechanical polishing (CMP) such that the upper surface 24 of the filled damascene opening is substantially coplanar with the upper surface 25 of the second dielectric layer 14. A capping layer 26, such as silicon nitride, is then deposited to encapsulate the dual damascene structure comprising Cu or Cu alloy line 22 connected to Cu or Cu alloy via 23 which is electrically connected to underlying Cu or Cu alloy line 16.

As miniaturization proceeds apace with an attendant shrinkage in the size of metal lines, e.g., metal lines having a width of about 0.3 micron and under, e.g., about 0.2 micron and under, it becomes increasingly difficult to maintain the requisite dimensional accuracy of the metal lines, particularly when implementing dual damascene techniques. In addition, the implementation of dual damascene techniques in Cu or Cu metallization involves a large number of processing steps which becomes a competitive factor. Accordingly, there exists a need for efficient interconnection methodology enabling the formation of metal features, such as metal lines, with high dimensional accuracy. There exists a particular need for Cu or Cu alloy dual damascene methodology enabling the formation of dual damascene interconnection structures comprising accurately dimensional lines having a width of about 0.3 micron and under, e.g., about 0.2 micron and under.

SUMMARY OF THE INVENTION

An advantage of the present invention is a semiconductor device comprising an interconnection pattern with high dimensional accuracy.

Another advantage of the present invention is an efficient method of manufacturing a semiconductor device comprising an interconnection pattern with accurately dimensioned metal lines.

Additional advantages and features of the present invention will be set forth in part in the description which follows, and in part will become apparent to those having ordinary skill in the art upon examination of the following or may be learned by practice of the present invention. The advantages of the present invention may be realized and obtained as particularly pointed out in the appended claims.

According to the present invention, the foregoing and other advantages are achieved in part by a method of manufacturing a semiconductor device, the method comprising: forming a silicon carbide capping layer/bottom anti-reflective coating (BARC) on a metal feature; forming a dielectric layer on the silicon carbide capping layer/BARC; forming a via hole defined by exposed side surfaces of the dielectric layer and a bottom terminating on the silicon carbide capping layer/BARC; and forming a trench in an upper portion of the dielectric layer in communication with the via hole.

Embodiments of the present invention comprise forming the silicon carbide capping layer/BARC at a thickness of about 300 Å to about 1,000 Å and having an extinction coefficient (k) of about −0.2 to about −0.5 on an underlying Cu or Cu alloy feature, e.g., a Cu or Cu alloy line, depositing an ILD containing a dielectric material with a dielectric constant no greater than about 3.9 at a thickness of about 2,000 Å to about 12,000 Å, optionally forming an organic BARC on the exposed silicon carbide capping layer/BARC at the bottom of the via hole, conducting a timed etched to form the trench in the ILD at a depth of about 300 Å to about 800 Å, and then sputter etching to remove the exposed silicon carbide capping layer/BARC at the bottom of the via hole, wherein removed silicon carbide redeposits on and forms a thin film of silicon carbide on the exposed side surfaces of the ILD to protect the ILD from copper diffusion. Embodiments of the present invention further include filling the dual damascene opening with Cu or a Cu alloy by electroless plating or electroless deposition, conducting CMP and Then forming a capping layer encapsulating the dual damascene structure. Advantageously, the capping layer can also comprise silicon carbide having an extinction coefficient of about −0.2 to about −0.5 to enable the formation of subsequent metal levels comprising features exhibiting high dimensional accuracy.

Another aspect of the present invention is a semiconductor device comprising: a dielectric layer containing a lower metal feature; a silicon carbide capping layer/BARC on an upper surface of the dielectric layer; an ILD on the silicon carbide capping layer/BARC; and a dual damascene structure formed in the ILD, the dual damascene structure comprising an upper metal line connected to a metal via in electrical contact with the lower metal feature.

Embodiments of the present invention comprise a semiconductor device wherein the lower metal feature, upper metal line and metal via comprise Cu or Cu alloy, the silicon carbide capping layer has an extinction coefficient (k) of about −0.2 to about −0.5, and a silicon carbide capping layer encapsulating the dual damascene structure, wherein the encapsulating silicon carbide layer has an extinction coefficient (k) of about −0.2 to about −0.5. As employed throughout this disclosure, the symbol Cu is intended to encompass high purity elemental copper as well as copper-based alloys, such as copper alloys containing minor amounts of tin, zinc, manganese, titanium, germanium, zirconium, strontium, palladium, magnesium, chromium and tantalum.

Additional advantages of the present invention will become readily apparent to those having ordinary skill in the art from the following detailed description, wherein embodiments of the present invention are described simply by way of illustration of the best mode contemplated for carrying out the present invention. As will be realized, the present invention is capable of other and different embodiments, and its several details are capable of modifications in various obvious respects, all without departing from the present invention. Accordingly, the drawings and descriptions are to be regarded as illustrative in nature and not as restrictive.

BRIEF DESCRIPTION OF THE DRAWINGS

In FIGS. 4 through 8, like elements or features are denoted by like reference numerals.

DESCRIPTION OF THE INVENTION

The present invention provides efficient methodology enabling the formation of semiconductor devices having interconnection patterns with improved dimensional accuracy, such as accurately dimensioned metal lines, e.g., Cu lines, having a width of about 0.3 micron and under, e.g., about 0.2 micron and under. This objective is achieved by the strategic use of silicon carbide as a combined capping layer and BARC on an underlying metal feature, e.g., a Cu line, and implementing dual damascene processing, particularly via first-trench last techniques, thereon.

Figure 1:
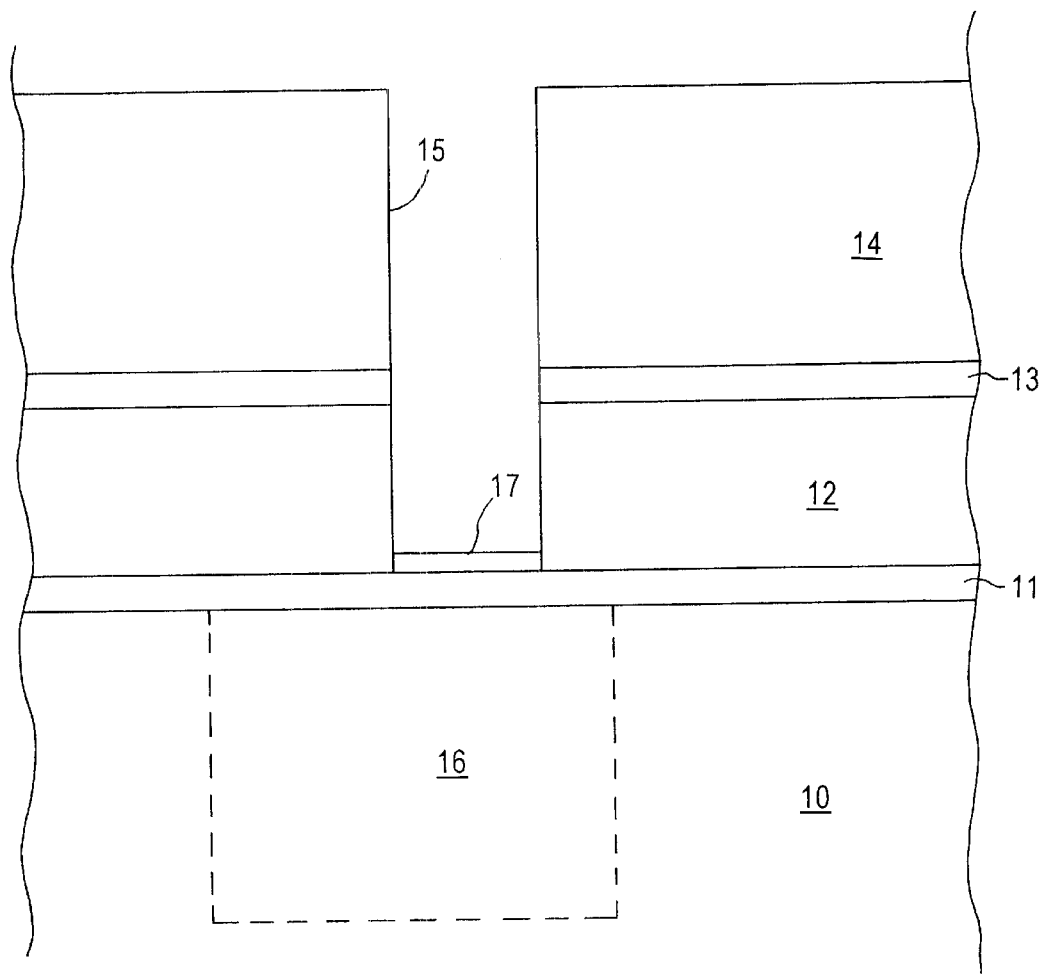
FIGS. 1 through 3 schematically illustrate sequential phases of a conventional via first-trench last dual damascene technique, wherein like elements or features are denoted by like reference numerals.
Figure 2:
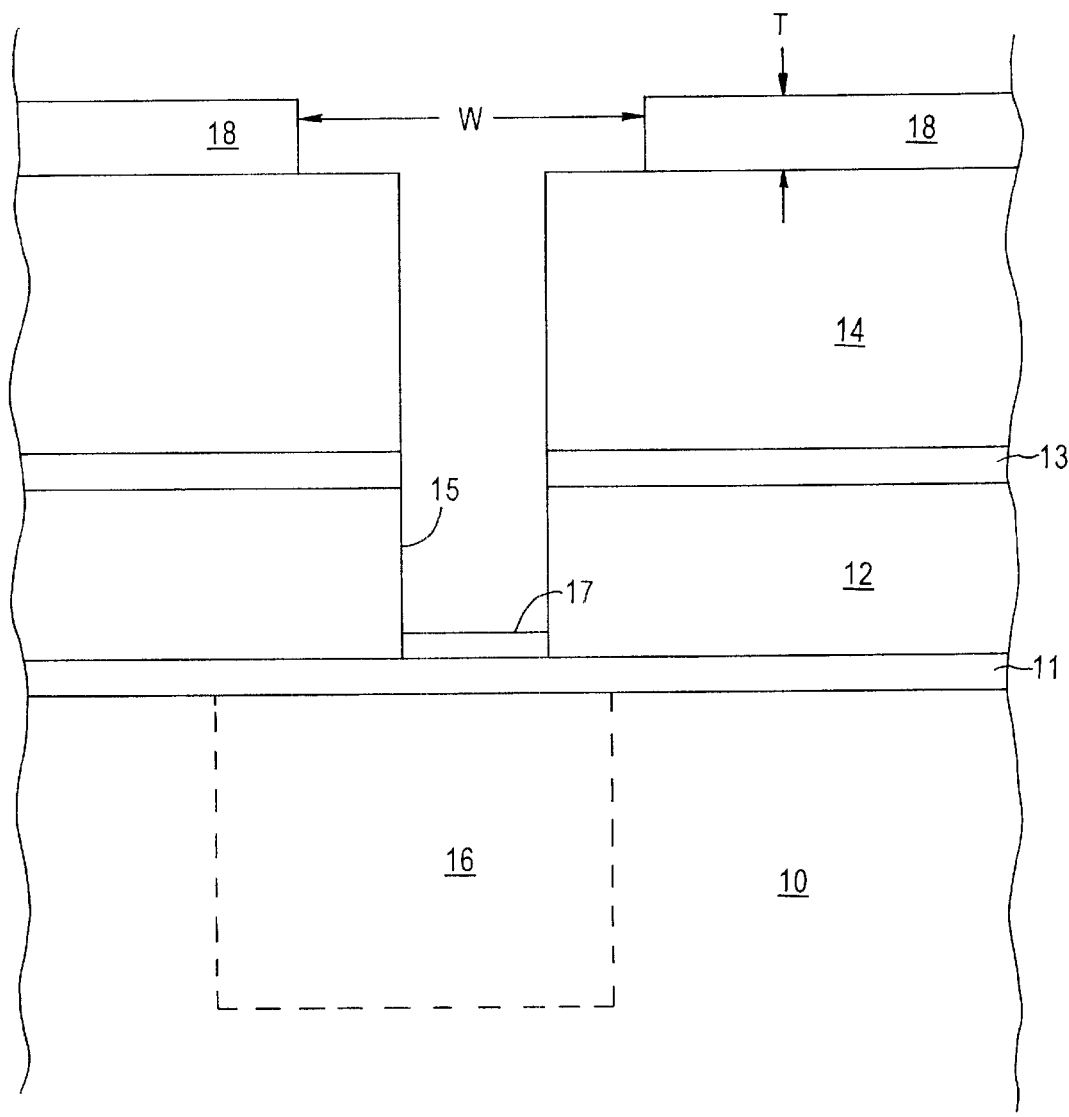
Figure 3:
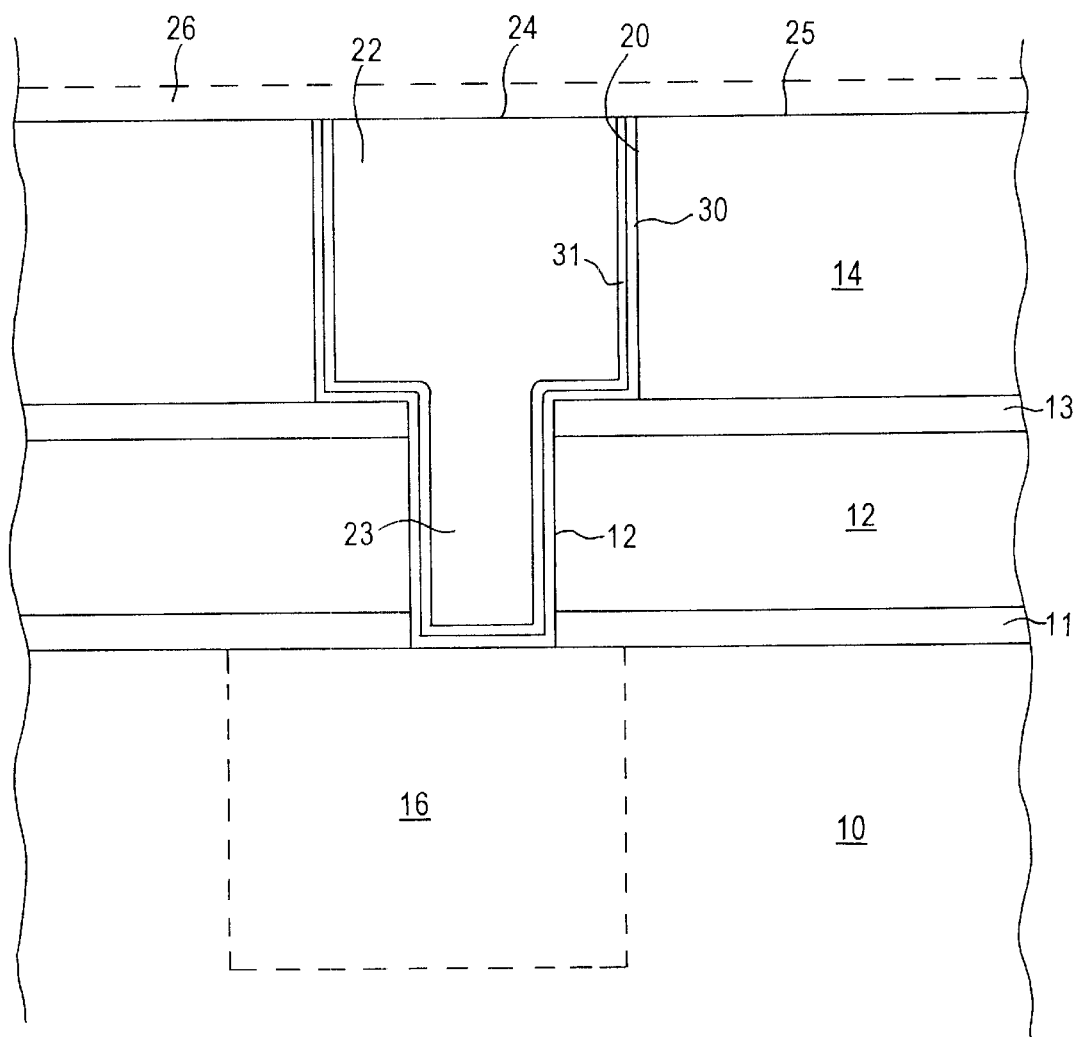
Figure 4:
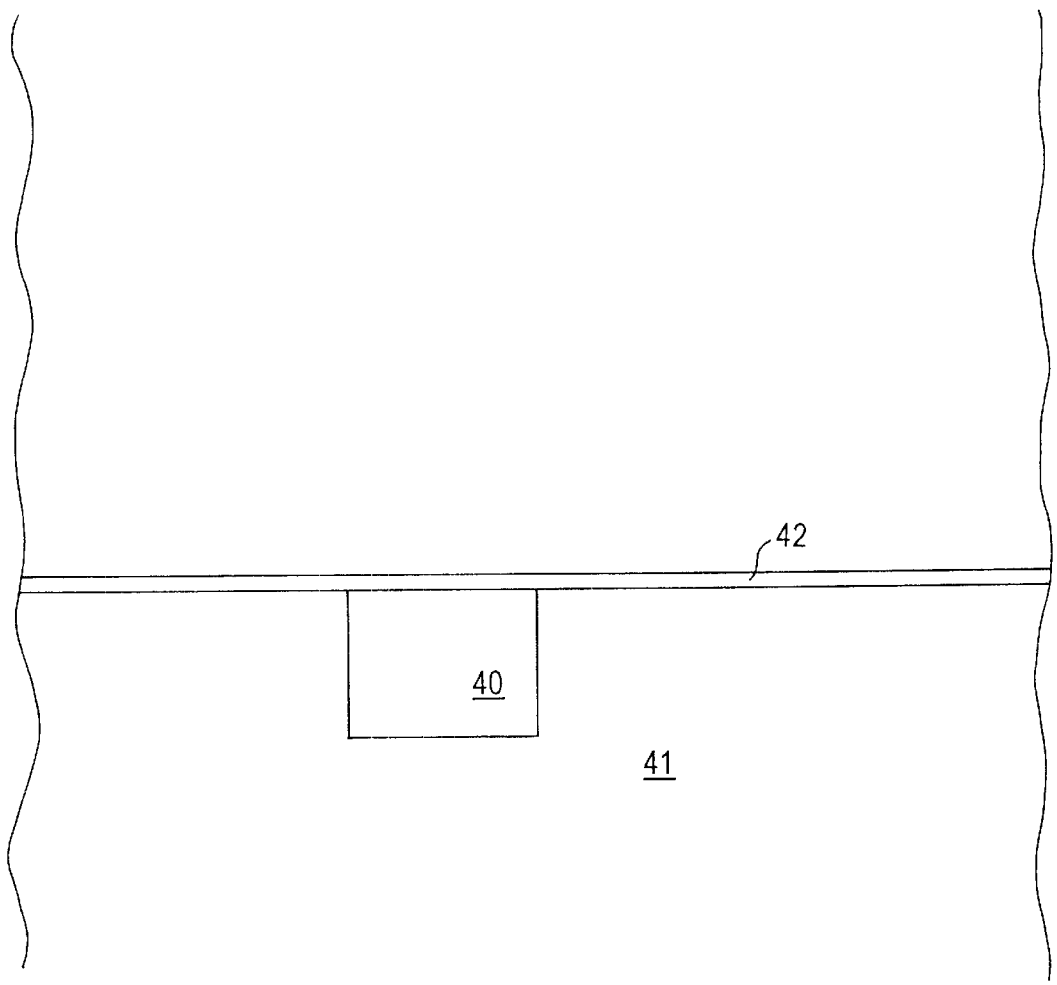
FIGS. 4 through 8 schematically illustrate sequential phases of a method in accordance with an embodiment of the present invention, with FIG. 8 schematically illustrating the resulting interconnection pattern.

As schematically illustrated in FIGS. 1 through 3, conventional via first-trench last dual damascene processing involving Cu metallization is implemented over a Cu feature 16 encapsulated by a silicon nitride layer 11, which is not particularly effective in enabling the formation of a dual damascene structure thereover with high dimensional accuracy. As also schematically illustrated in FIGS. 1 through 3, conventional methodology comprises the use of a middle etch stop layer 13, typically silicon oxynitride, thereby requiring separate deposition steps for depositing dielectric layer 12, metal etch stop 13 and dielectric layer 14, and, hence, adversely impacting throughput and increasing manufacturing costs. The present invention addresses and solves the dimensional accuracy issue generated by such conventional practices and further enhances throughput by providing efficient methodology strategically employing silicon carbide as a combined capping layer/BARC and depositing a single dielectric layer constituting an ILD, advantageously utilizing the anti-reflective properties of the silicon carbide capping layer/BARC having an extinction coefficient of −0.2 to about −0.5.

In accordance with embodiments of the present invention, silicon carbide is strategically employed as a combined capping layer/BARC in implementing dual damascene techniques, particularly via first-trench last dual damascene techniques. Silicon carbide can be deposited such that it exhibits an extinction coefficient (k) of about −0.2 to about −0.5, by chemical vapor deposition.

The use of a silicon carbide capping layer/BARC encapsulating a lower Cu feature advantageously enables the formation of a dual damascene structure thereover employing a single dielectric layer as the ILD with an attendant improvement in manufacturing throughput yielding an interconnection structure with an accurately dimensioned metal line. Embodiments of the present invention include the use of an optional organic BARC at the bottom of the via, such as AZKrF78B available from CLARIANT located in Sommerville, N.J. and AR7 available from Shipley located in Marlborough, Mass. The use of such an organic BARC compliments the silicon carbide capping layer/BARC and protects the bottom of the via during trench formation. Advantageously, the silicon carbide capping layer/BARC at the bottom of the via is removed, as by sputter etching, whereby removed silicon carbide is redeposited on and forms a thin film lining the side surfaces of the ILD to protect the ILD from Cu diffusion. The trench is anisotropically etched, using a timed etch, so that the depth of the trench can be suitable controlled, as to a depth of about 300 Å to about 800 Å, depending upon design specifications. Advantageously, in implementing Cu metallization to form a dual damascene structure overlying a Cu metal line, a silicon carbide capping layer/BARC can be employed on the dual damascene structure thereby facilitating formation of an overlying damascene structure with high dimensional accuracy in an efficient, cost-effective manner.

An embodiment of the present invention is schematically illustrated in FIGS. 4 through 8. Adverting to FIG. 4, Cu feature 40, such as a Cu line, is formed in dielectric layer 41. In accordance with the present invention, a silicon carbide capping layer/BARC 42 is formed on dielectric layer 41 encapsulating Cu line 40. Silicon carbide capping layer/BARC 42 is advantageously deposited under conditions such that it exhibits an extinction coefficient (k) of about −0.2 to about −0.5, and at a suitable thickness, such as about 300 Å to about 1,000 Å. Thus, silicon carbide capping layer/BARC 42 not only serves as a capping layer but advantageously functions as a BARC.

Figure 5:
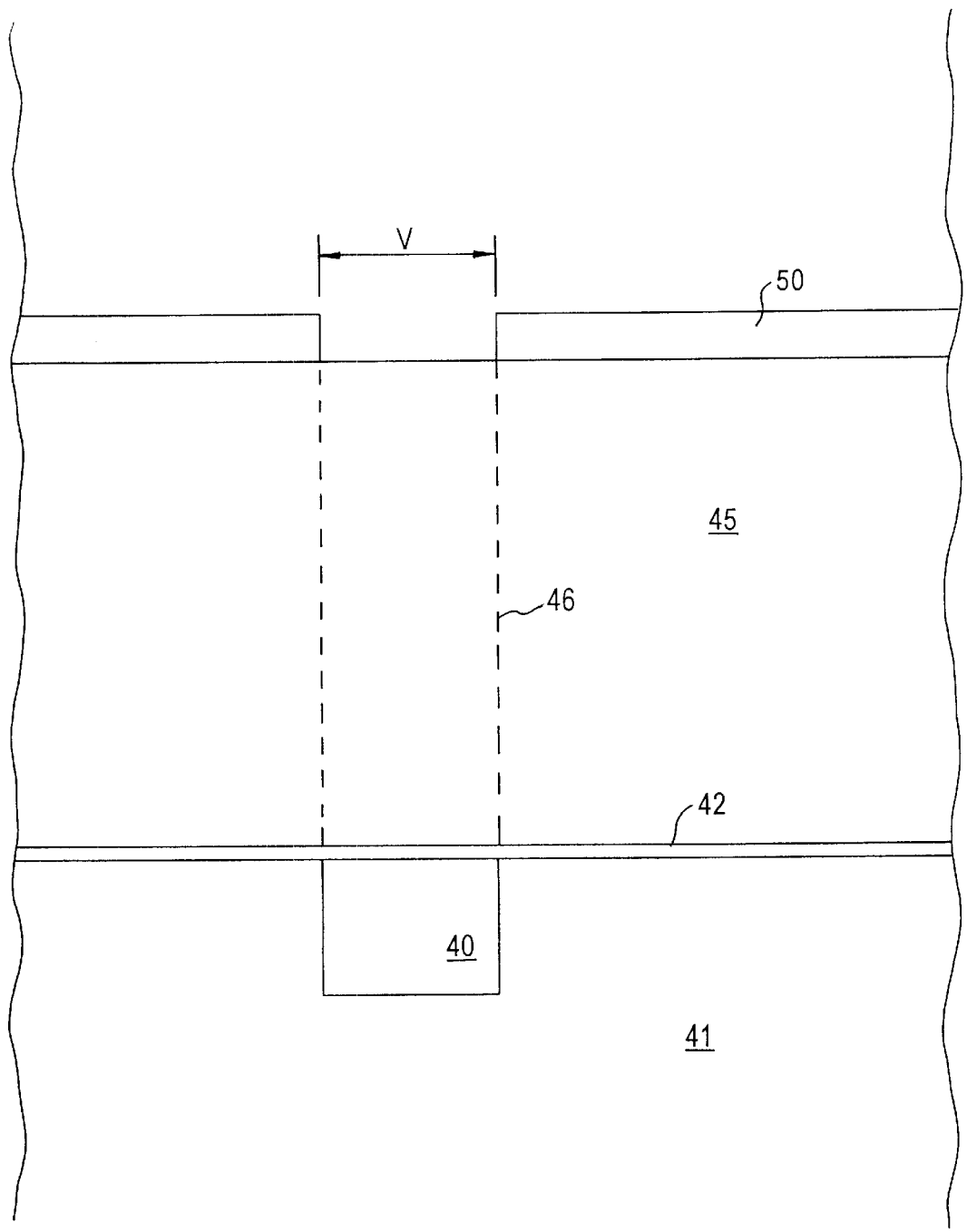
Figure 6:
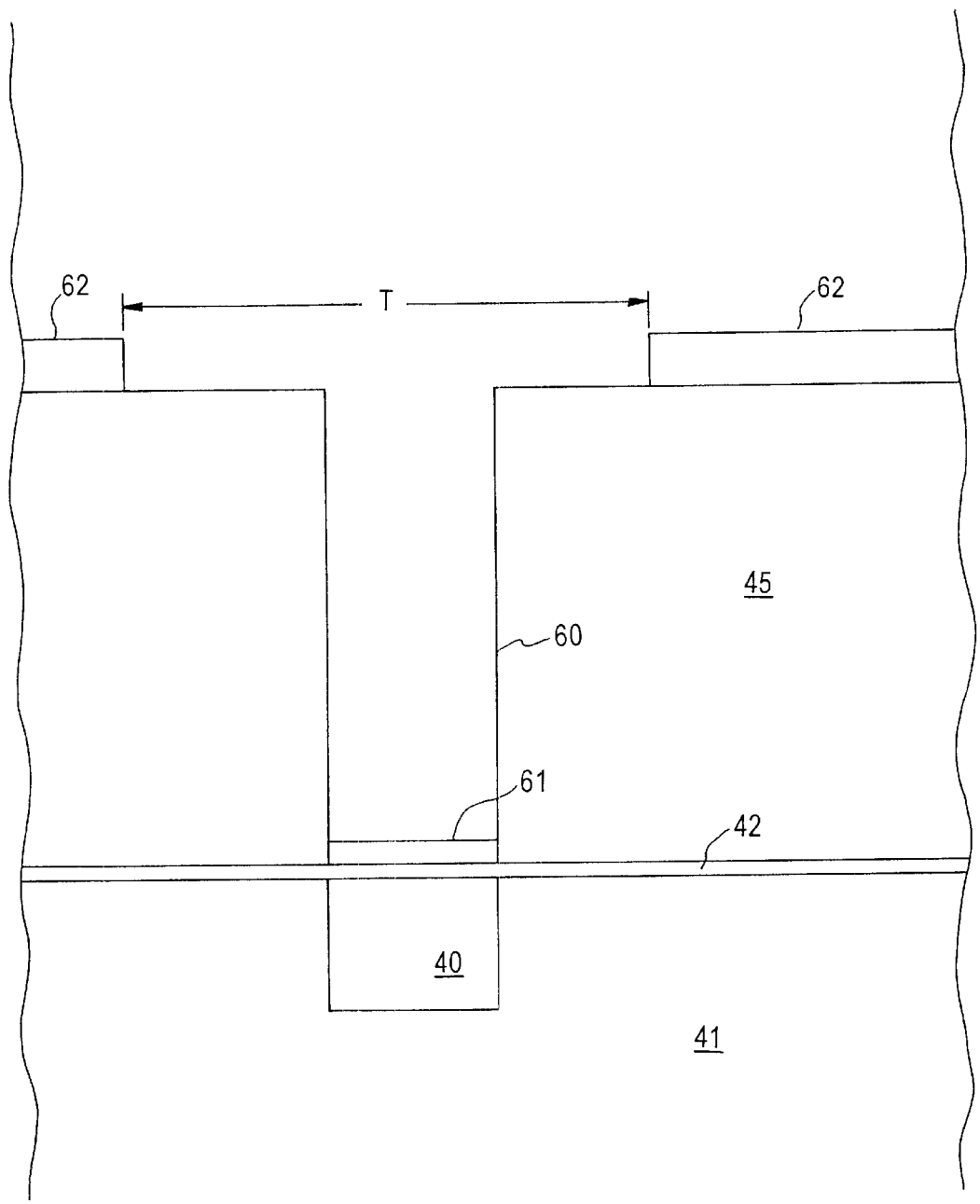

As illustrated in FIG. 5, ILD 45 is then deposited on silicon carbide capping layer/BARC 42, at a suitable thickness to accommodate therein the formation of a dual damascene opening comprising a trench and via hole. ILD 45 can, for example, be deposited at a thickness of about 2,000 Å to about 12,000 Å, depending upon design specifications, and can comprise any suitable dielectric material, including a low-k dielectric material having a dielectric constant of about 3.9 or less. A via mask 50 is then formed on ILD 45. Via mask 50 contains an opening "V" substantially corresponding to the cross sectional width of the via hole to be formed in ILD 45. As shown by phantom lines 46. Anisotropic etching is then conducted to form via hole 60 in ILD 45, as shown in FIG. 6. An optional organic BARC 61 is then deposited and formed at the bottom of via 60 for enhancing the anti-reflective contribution and to protect to the silicon carbide capping layer/BARC at the bottom of via 60. As also illustrated in FIG. 6, a trench photoresist mask 62 is formed on ILD 45. Trench photoresist mask 62 contains an opening "T" substantially corresponding to the width of the trench to be formed in ILD 45.

Figure 7:
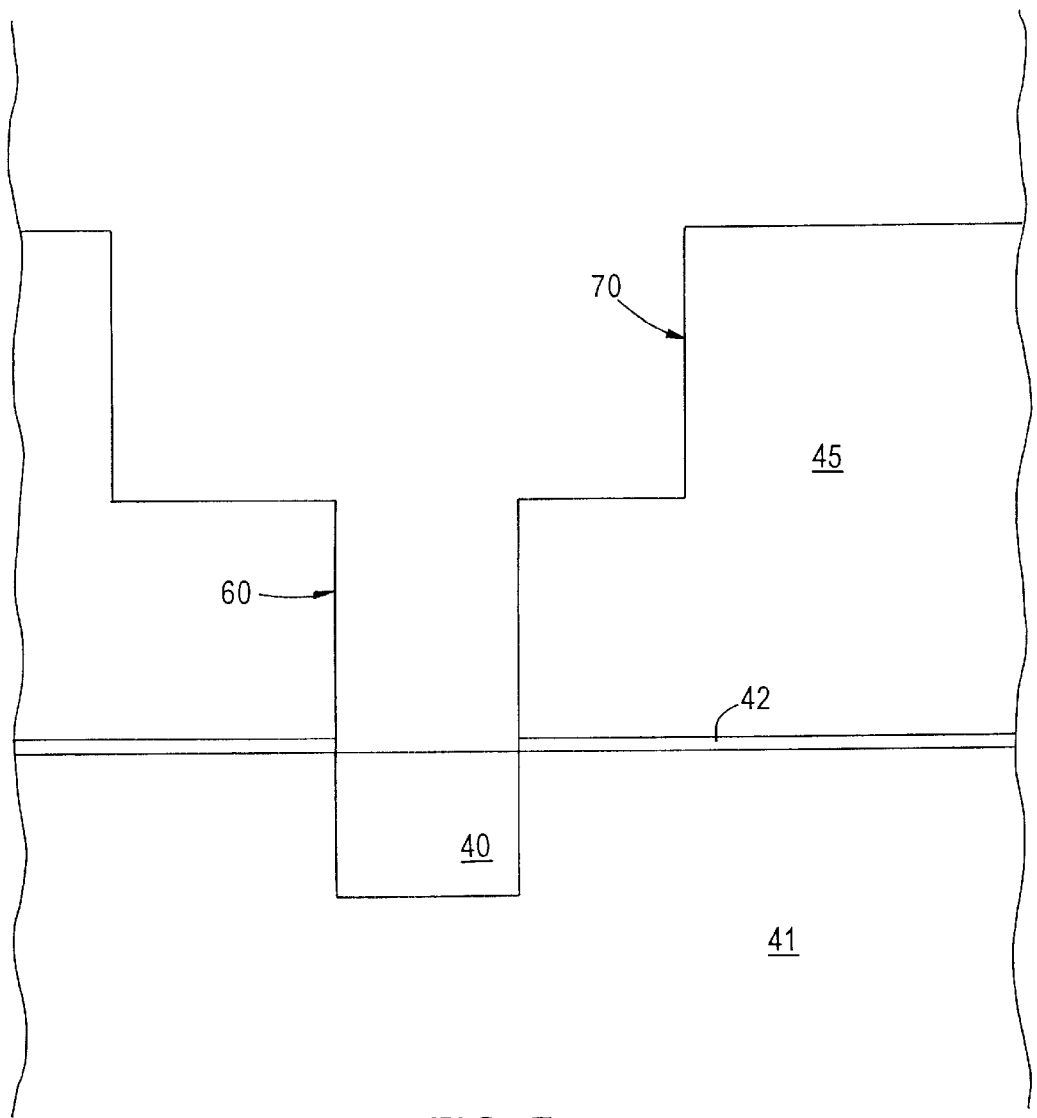

Anisotropic etching is then conducted to form trench 70 in ILD 45, as illustrated in FIG. 7. A conventional timed etching technique is employed such that trench 70 is formed in ILD 45 to a suitable depth depending upon design specifications, as to about 300 Å to about 800 Å from the upper surface of ILD 45. Trench photoresist mask 62 is then removed in a conventional manner, as by oxygen ($O_2$), ashing. Organic BARC 61 is removed during trench formation and/or subsequent thereto in a conventional manner. The exposed portion of silicon carbide capping layer/BARC 42 at the bottom of the via 60 is then removed, as by sputter etching. Advantageously, removed silicon carbide redeposites on and forms a thin film (not shown) on the side surfaces of the via protecting ILD 45 from Cu diffusion from underlying Cu feature 40.

Figure 8:
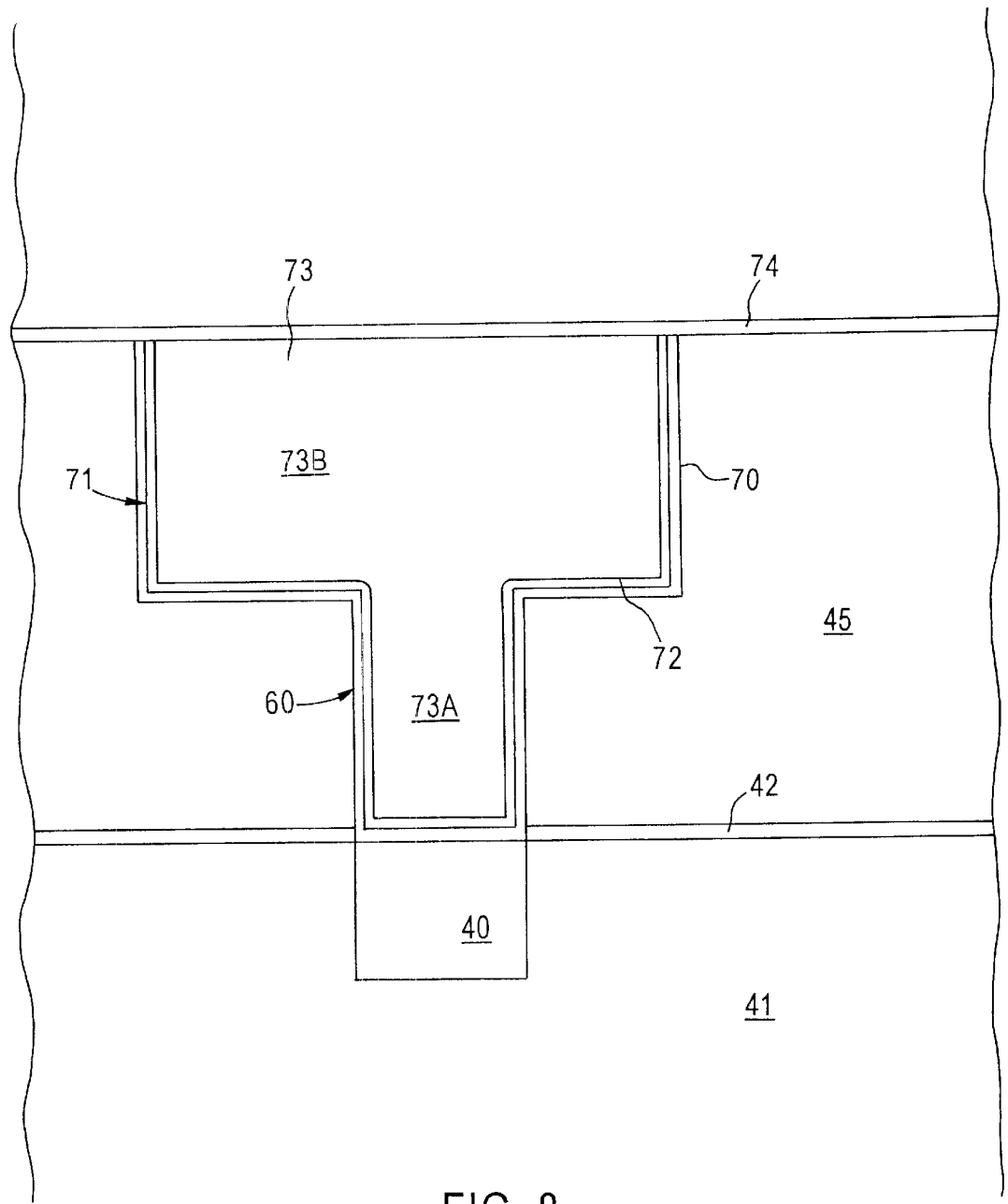

As illustrated in FIG. 8, Cu metallization is then implemented in a conventional manner, as by initially depositing a barrier layer 71, such as Ta or TaN, lining the dual damascene opening comprising trench 70 connected to underlying via hole 60. A seedlayer 72 is then deposited on barrier layer 71 and Cu 73 deposited, as by electroless deposition or electrodeposition. The overburden (not shown) is then removed in a conventional manner, as by CMP. A capping layer is then 74 deposited to encapsulate dual damascene structure comprising Cu line 73B connected to Cu via 73A which is electrically connected to underlying Cu line 40. Advantageously, capping layer 74 can comprise a layer of silicon carbide having an extinction coefficient of about −0.2 to about −0.5. Thus, silicon carbide capping layer 74 can also serve as a BARC, thereby facilitating the efficient formation of a dual damascene structure thereon comprising a metal feature with greater accuracy and fewer processing steps. Seedlayer 72 can include alloys of copper with elements such as magnesium, aluminum, zinc, zirconium, tin, nickel, palladium, gold or silver, in suitable amounts, e.g., about 0.3 to about 12 at.%.

Dielectric materials suitable for use in the present invention include various materials conventionally employed in the manufacture of semiconductor devices, as for ILDs, including low-k materials having a dielectric constant of about 3.9 or under. The value of a dielectric constant expressed herein is based upon a value of one for a vacuum. For example, dielectric materials suitable for use in embodiments of the present invention include flowable oxides which are basically ceramic polymers, such as hydrogen silsesquioxane (HSQ), as well as organic low-k materials, typically having a dielectric constant of about 2.0 to about 3.8, such as FLARE 2.0™ dielectric, a poly(arylene)ether available from Allied Signal, Advanced Microelectronic Materials, Sunnyvale, California, Black-Diamond™ dielectric available from Applied Materials, Santa Clara, Calif., BCB (divinylsiloxane bisbenzocyclobutene) and Silk™ an organic polymer similar to BCB, both available from Dow Chemical Co., Midland, Mich.

The present invention advantageously enables the efficient fabrication of damascene structures in the deep sub-micron regime, e.g., metal lines having a width of about 0.3 micron or under, e.g., about 0.2 micron and under, including Cu lines. The present invention is particularly applicable to via first-trench last dual damascene techniques.

The present invention enjoys industrial applicability in manufacturing various types of semiconductor devices. The present invention is particularly applicable in manufacturing semiconductor devices with high circuit speeds having design features in the deep sub-micron regime.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of manufacturing a semiconductor device the method comprising:
    forming a silicon carbide capping layer/bottom anti-reflective coating (BARC) on a metal feature;
    forming a single dielectric layer on the silicon carbide capping layer/BARC;
    forming a via hold defined by exposed side surfaces of the dielectric layer and a bottom terminating on the silicon carbide capping layer/BARC; and
    forming a trench in an upper portion of the dielectric layer in communication with the via hole.

2. The method according to claim 1, wherein the metal feature comprises copper (Cu) or a Cu alloy.

3. The method according to claim 2, further comprising sputter etching, after forming the trench, to remove the silicon carbide capping layer/BARC at the bottom of the via hole to expose an upper surface of the Cu or Cu alloy feature, wherein removed silicon carbide is redeposited on and forms a protective film on the exposed side surfaces of the dielectric layer in the via hole.

4. The method according to claim 3, comprising filling the via hole and trench with Cu or a Cu alloy to form a dual damascene structure comprising a Cu or Cu alloy line connected to a Cu or Cu alloy via which is electrically connected to the underlying Cu or Cu alloy feature.

5. The method according to claim 4, comprising:
    depositing a barrier layer to line the trench and via hole;
    depositing a seedlayer on the barrier layer; and
    electrodepositing or electrolessly depositing the Cu or Cu alloy to fill the via hole and trench.

6. The method according to claim 2, comprising forming an organic anti-reflective coating (ARC) on the silicon carbide capping layer/BARC at the bottom of the via hole.

7. The method according to claim 6, comprising forming the organic ARC at a thickness of about 300 Å to about 1,000 Å.

8. The method according to claim 6, comprising:
    removing the organic ARC after forming the trench; and
    sputter etching to remove the silicon carbide/BARC at the bottom of the via hole.

9. The method according to claim 2, comprising forming the silicon carbide capping layer/BARC at a thickness of about 300 Å to about 1,000 Å.

10. The method according to claim 2, comprising forming the silicon carbide capping layer/BARC with an extinction coefficient (k) of about −0.2 to about −0.5.

11. The method according to claim 1, comprising forming the dielectric layer at a thickness of about 2,000 Å to about 12,000 Å.

12. The method according to claim 1, comprising anisotropically etching to form the trench in the dielectric layer to a depth of about 300 Å to about 800 Å.

13. The method according to claim 1, wherein the dielectric layer comprises a dielectric material having a dielectric constant of about 3.9 or less.

14. A semiconductor device comprising:
    a dielectric layer containing a lower metal feature;
    a silicon carbide capping layer/bottom anti-reflective coating (BARC) on an upper surface of the dielectric layer;
    a single interlayer dielectric (ILD) on the silicon carbide capping layer/BARC; and
    a dual damascene structure formed in the ILD, the dual damascene structure comprising an upper metal line connected to a metal via in electrical contact the lower metal feature.

15. The semiconductor device according to claim 14, wherein the lower metal feature comprises a lower copper (Cu) or a Cu alloy line.

16. The semiconductor device according to claim 15, wherein the silicon carbide capping layer/BARC has an extinction coefficient (k) of about −0.2 to about −0.5.

17. The semiconductor device according to claim 15, wherein the dual damascene structure comprises, sequentially, a barrier layer and seedlayer between the ILD and Cu or Cu alloy line and via.

18. The semiconductor device according to claim 15, wherein the silicon carbide capping layer/BARC has a thickness of about 300 Å to about 1,000 Å.

19. The semiconductor device according to claim 15, further comprising a second silicon carbide capping layer/BARC on the upper Cu or Cu alloy line and on the ILD.

20. The semiconductor device according to claim 19, wherein the second silicon carbide capping layer/BARC has an extinction coefficient of about −0.2 to about −0.5.

* * * * *